(12) United States Patent
Tan et al.

(10) Patent No.: US 6,372,622 B1
(45) Date of Patent: Apr. 16, 2002

(54) FINE PITCH BUMPING WITH IMPROVED DEVICE STANDOFF AND BUMP VOLUME

(75) Inventors: Qing Tan; Stanley Craig Beddingfield, both of Austin, TX (US); Douglas G. Mitchell, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/426,982

(22) Filed: Oct. 26, 1999

(51) Int. Cl.[7] ............................................... H01L 21/44
(52) U.S. Cl. .................... 438/612; 438/613; 438/614; 228/180.22
(58) Field of Search ................ 438/612–614; 228/180.22

(56) References Cited

U.S. PATENT DOCUMENTS 5,989,993 A * 11/1999 Zakel et al. ................ 438/614

* cited by examiner

*Primary Examiner*—John F. Niebling
*Assistant Examiner*—David A. Zarneke
(74) *Attorney, Agent, or Firm*—Joanna G. Chiu

(57) ABSTRACT

Embodiments of the present invention relate generally to solder bump formation and semiconductor device assemblies. One embodiment related to a method for forming a bump structure includes providing a semiconductor device (10) having a bond pad (12), and forming a first masking layer (20) overlying the bond pad (12). The first masking layer (20) is patterned to form a first opening (22) overlying at least a portion of the bond pad (12). A second masking layer (40) is formed overlying the first masking layer (20), and the second masking layer (40) is patterned to form a second opening (42) overlying at least a portion of the first opening (22). The method further includes forming a stud (30) at least within the first opening (22) and a solder bump (60) at least within the second opening (42).

23 Claims, 5 Drawing Sheets

FINE PITCH BUMPING WITH IMPROVED DEVICE STANDOFF AND BUMP VOLUME

FIELD OF THE INVENTION

The present invention relates to surface-mount semiconductor device processing, and, more particularly, to solder bump formation on semiconductor devices and products.

DESCRIPTION OF THE RELATED ART

Electronic assemblies often employ integrated circuit (IC) devices, which are generally characterized as being electrically and mechanically attached to a substrate of an electronic circuit assembly with a number of terminals or leads that are soldered, such as with a tin-lead solder, to conductors on the surface of the substrate. A prominent example of a SM IC is a flip chip, which has terminals typically in the form of solder bumps. Due to the numerous functions typically performed by the microcircuitry of a flip chip, a relatively large number of solder bumps are often required.

As integrated circuit sizes continue to shrink, there is an increased need for fine pitch solder bump flip chip assemblies in order to provide enhanced electrical performance together with reduced cost. However, existing solder bump technology provides insufficient solder volume to ensure reliable performance for devices with less than a 225 um pitch. Pitch is defined as the minimum center-to-center distance between solder bumps on a particular flip chip assembly. Moreover, because existing electroplate bump technology uses a single photo exposure to define the openings for both the conductive stud and solder bump plating, the plated solder volume is limited by both diameter and circular shape of the conductive stud.

FIG. 1, labeled prior art, illustrates in cross-section a portion of a semiconductor device 13 that has been partially fabricated using a single photo exposure step to define the openings for both a copper stud and solder bump plating. Semiconductor device 13 includes substrate 10, bond pads 12, passivation layer 11, barrier layer 14, photoresist 16, plated copper studs 18, and plated solder bumps 17 and 19. As shown in FIG. 1, plated solder bumps 17 and 19 have been grown from copper studs 18 and mushroomed over photoresist layer 16. That is, plated solder bumps 17 and 19 overflow edges 21. When the existing technology is used for fine pitch application, plated solder bumps 17 and 19 encroach upon each other, as shown in FIG. 1, possibly shorting bond pads 12. Furthermore, as pitch decreases, the volume of solder bumps 17 and 19 also typically decreases to prevent such a shorted condition. Reduced solder volume causes lessened standoff between surface-mount coupled devices which results in the inability of underfill material to flow between the coupled devices. Both reduced standoff and insufficient underfill flow could result in lessened reliability.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

Figure 1:
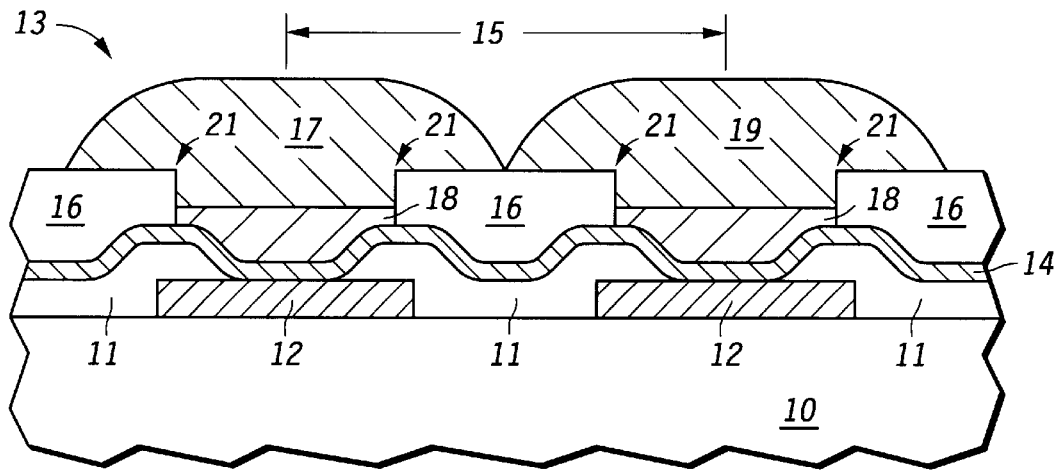
FIG. 1, labeled prior art, is a cross-sectional view of the conventional fabrication of a semiconductor device having solder bumps.

Skilled artisans appreciate that elements in the figures are illustrated for simplicity and clarity and have not necessarily been drawn to scale. For example, the dimensions of some of the elements and figures may be exaggerated relative to other elements to help improve understanding of embodiments of the present invention.

DETAILED DESCRIPTION [OF THE PREFERRED EMBODIMENTS]

Embodiments of the present invention relate generally to solder bump formation and semiconductor device assemblies. One embodiment, related to a method for forming a bump structure, includes providing a semiconductor device having a bond pad, and forming a first masking layer overlying the bond pad. The first masking layer is patterned to form a first opening overlying at least a portion of the bond pad, and a stud is formed at least within the first opening. A second masking layer is formed overlying the first masking layer and the stud, and the second masking layer is patterned to form a second opening overlying at least a portion of the stud. The method further includes forming a solder bump at least within the second opening.

Another embodiment related to a method for forming a bump structure includes providing a semiconductor device having a bond pad and forming a masking layer overlying the bond pad having a first portion and a second portion. The first portion of the masking layer is closer to the semiconductor device than the second portion of the masking layer. A first opening is formed in the first portion of the masking layer and a second opening is formed in the second portion of the masking layer. The first opening overlies at least a portion of the bond pad and the second opening overlies at least a portion of the first opening. The method further includes forming a solder bump at least within the second opening.

One embodiment related to a semiconductor device assembly includes a substrate and a semiconductor device attached to the substrate via a plurality of solder bumps. The plurality of solder bumps have a pitch that is less than or equal to approximately 200 microns and at most approximately four times a distance between the substrate and the semiconductor device.

The following discussion is intended to provide a detailed description of at least one example of the invention and should not be taken to be limiting of the invention itself. Rather, any number of variations may fall within the scope of the invention which is properly defined in the claims following this description.

As is discussed in greater detail below, a first resist layer or masking layer overlays a semiconductor device for Cu stud plating, and a second, often thicker, resist layer or masking layer is overlaid for solder plating. By using two separate resist layers, the mask opening area for solder plating can be increased. For example, a first opening having a first size and shape may be used to define the studs, and a second, larger size and shape may be used to define the solder bumps, thereby increasing the solder volume of the resulting solder bump while allowing finer pitch solder bump formation with improved standoff. This method also offers the mask designer the flexibility to further increase the solder volume when the IC does not have a full area array of bumps. Increased solder volume provides increased standoff distance between flip chip interconnected semiconductor devices and substrates (flip chip assemblies). Increased standoff provides improved underfill flow between the interconnected devices and substrates, which in turn increases reliability of the resulting flip chip assembly.

For example, in one embodiment, calculations have shown that for a 150 $\mu$m full area array device, the maximum solder volume for one previously existing electroplating bumping process is 378,000 $\mu$m$^3$. Based on the teachings herein, the maximum solder volume may be increased to 720,000 $\mu$m$^3$ on a similar device. In addition, such an increase in solder volume offers, for example, a 79 $\mu$m standoff after assembly. With such a standoff, the existing assembly and underfill process offer greatly improved reliability and performance. Thus, the solder bump volume can be increased by up to and over 90% using 150 $\mu$m pitch as an example.

Referring now to FIGS. 2–8, a method of fabricating a semiconductor device to have a solder bump will now be described in detail. The cross-sections of FIGS. 1–8 illustrate this method as a portion of an overall process flow for fabricating the semiconductor device. As will be apparent to those of ordinary skill in the art, the partial process flow to be described herein may be applied in the fabrication of many types of semiconductor devices, in which the full process flow will include many other process steps conventional in the art.

Figure 2:
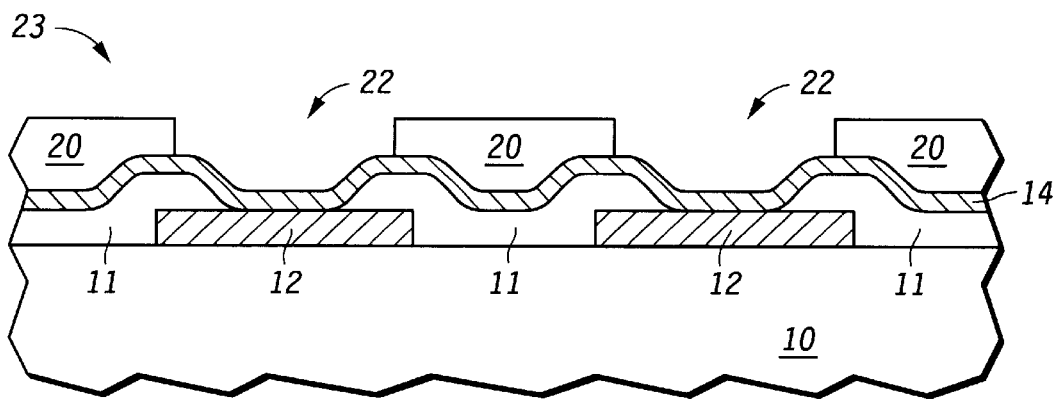
FIGS. 2–8 are cross-sectional views of the fabrication of a semiconductor device having solder bumps.
Figure 13:
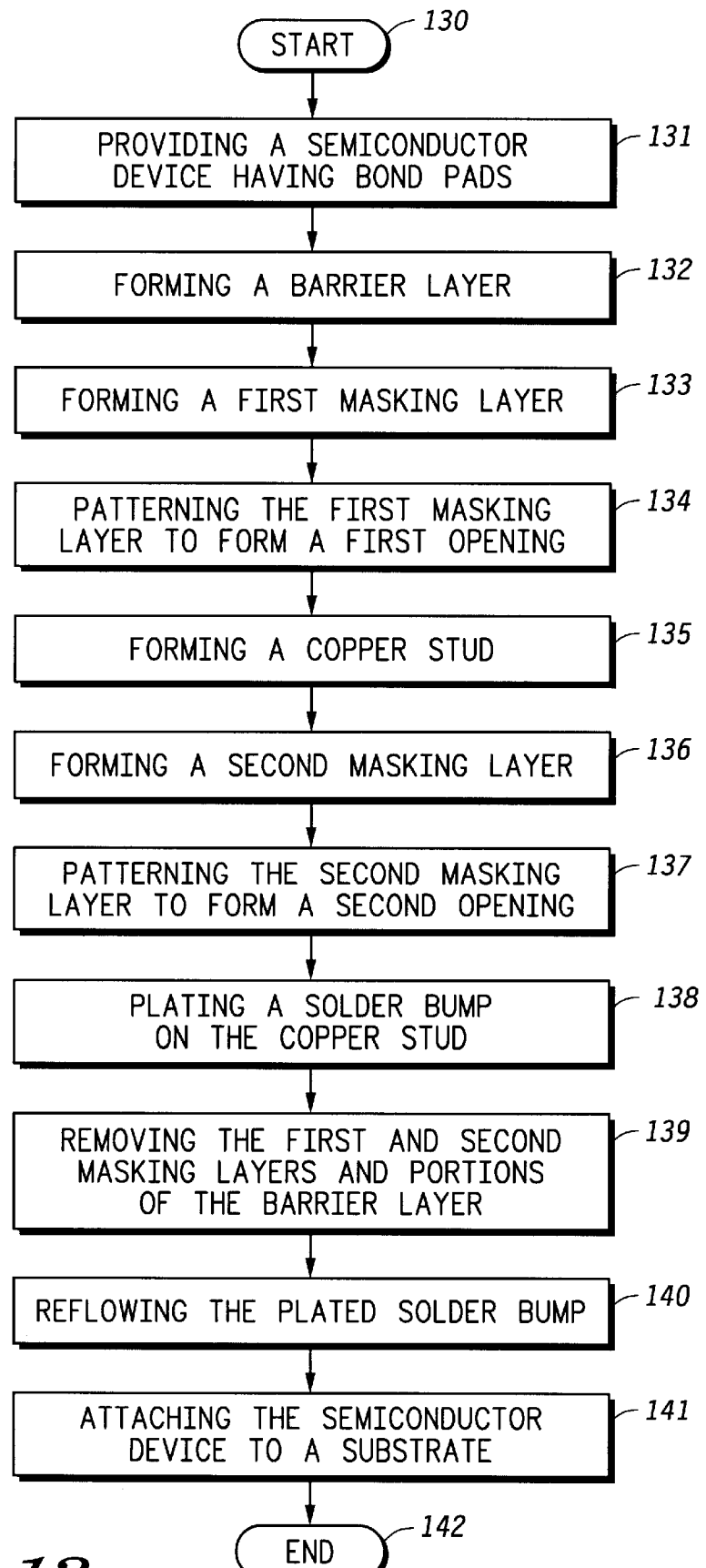
FIG. 13 is a flow chart illustrating a method for fabricating a semiconductor device having solder bumps.

Referring to FIGS. 2 and 13, wafer 23 is provided at step 131. Wafer 23 includes substrate 10 with bond pads 12 and passivation layer 11 overlying substrate 10. Substrate may be any type of appropriate substrate material such as silicon or gallium arsenide. Substrate 10 can include a variety of semiconductor devices and integrated circuits. Bond pads 12 may be any appropriate material such as aluminum or copper. Passivation layer 11 may be any type of appropriate passivation layer material such as silicon nitride, oxynitride, polyimide, or PSG.

At step 132, barrier layer 14 is formed over passivation layer 11 and bond pads 12. Barrier layer 14 may be any type of appropriate barrier layer material such as titanium tungsten and/or titanium tungsten nitride. Barrier layer 14 may also include a sputtered layer of copper overlying the titanium tungsten and/or titanium tungsten nitride layers to provide a seed layer for electroplating, for example. Barrier layer 14 may also include an adhesion layer such titanium tungsten, titanium tungsten nitride, tantalum nitride, or chrome. Barrier layer 14 may therefore include a plurality of layers, each performing a different function and including different materials. Alternate embodiments may not include a barrier layer, or may include only an adhesion and/or a seed layer, for example.

At step 133, a first resist layer 20 is formed over barrier layer 14. Resist layer 20 may be a photoresist layer or any other appropriate photo imageable polymer or other appropriate photoresist material. Alternatively, any type of resist or masking layer may be used such as resist layers responsive to nonvisible radiation. In one embodiment resist layer 20 is in a range of approximately 5 to 50 microns. In another embodiment, photoresist layer 20 is in a range of approximately 10 to 20 microns, and preferably approximately 15 microns thick. At step 134, resist layer 20 is patterned to form openings 22 where, in one embodiment, openings 22 are smaller than bond pads 12.

Figure 3:
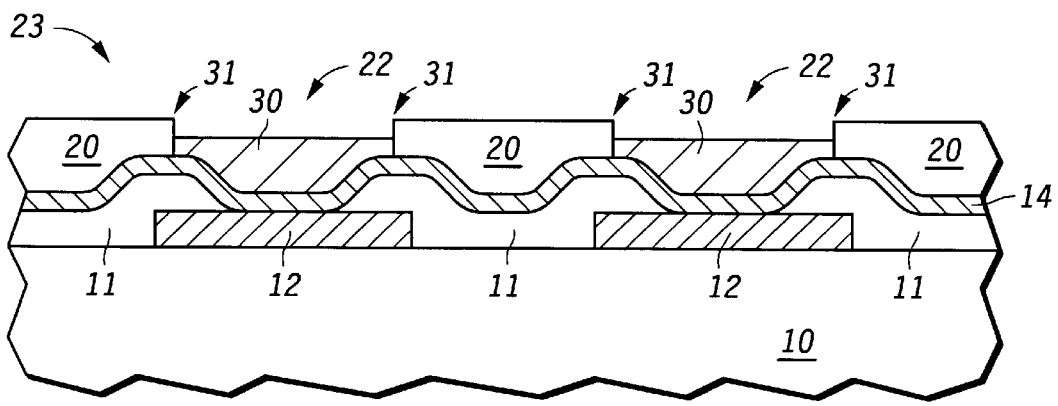

Referring to FIGS. 3 and 13, copper studs 30 are formed over barrier layer 14 and bond pads 12 in openings 22 at step 135. Copper stud 30 is grown from a seed layer contained in barrier layer 14. Although the present embodiment includes copper studs 30, other embodiments may include other materials (such as other conductive materials) to construct studs in openings 22. Also in the present embodiment, copper studs 30 are totally within openings 22. In other embodiments using other processes, copper studs 30 may overlap edges 31 of photoresist layer 20.

Figure 4:
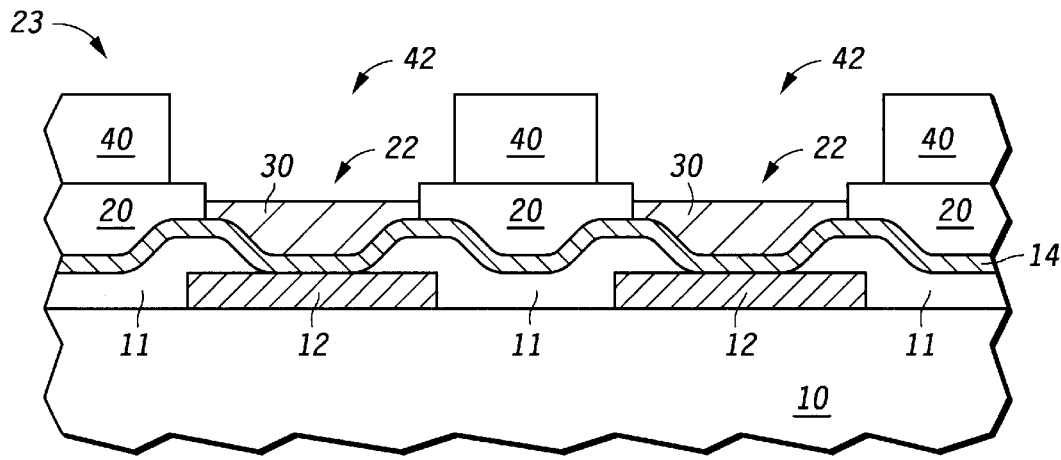

Referring to FIGS. 4 and 13, a second resist layer 40 is formed over resist layer 20 and copper studs 30. Just as resist layer 20, resist layer 40 may be a photoresist layer or any other appropriate masking layer. Resist layer 40 may even be of a different type of masking layer than resist layer 20. At step 137, the second resist layer 40 is patterned to form openings 42. In one embodiment, openings 42 are larger than openings 22. Also in the present embodiment, openings 22 are centered within openings 42. However, they need not be centered within openings 42, as will be discussed with reference to FIG. 5 below. Openings 42 can be as large as possible to accommodate sufficient solder volume so long as the reflowed solder bumps do not encroach upon each other.

Resist layer 40 is generally thicker than resist layer 20; however, alternate embodiments may use two resist layers of equal thickness, or resist layer 20 may even be thicker than resist layer 40. Also, openings 42 can be of various different shapes such as circular, rectangular, or other shapes depending on the solder bump layout. Openings 22 can likewise be of various shapes and sizes and are not limited to circles.

An alternate embodiment may use a single masking layer having two portions where a first portion contains openings 22 and a second portion contains openings 42. One way to accomplish this result is to use a signal pass photoresist coating and expose it twice. The first exposure creates the small opening to define the copper stud, while the second exposure creates the large opening for defining the solder. The exposure time and energy for the second exposure is controlled in such a way that it only exposes a certain depth of the photoresist. Therefore, a first opening is formed in the masking layer to define the stud, followed by a second opening in the same masking layer to define the solder bump. This embodiment would provide similar flexibilities as discussed with the two separate masking or resist layers.

Figure 5:
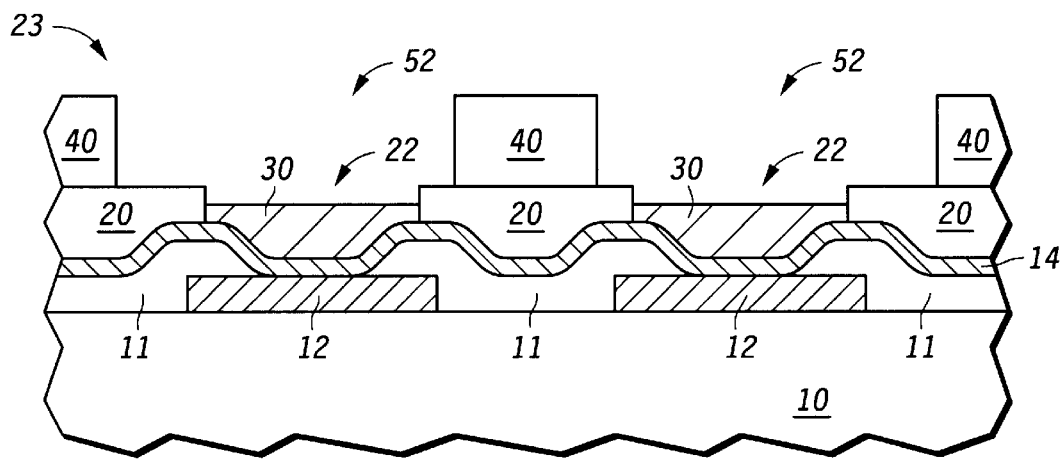

If copper studs 30 overlap edges 31 of resist layer 20, openings 42 are patterned in the present embodiment to expose a portion of resist layer 20. In one embodiment, resist layer 40 is approximately 20 to 60 microns thick, preferably approximately 35 microns thick. In another embodiment resist layer 40 is approximately 50 microns thick. As shown in FIG. 5, openings 52 in photoresist layer 40 can be offset to allow bond pads 12 to be closer together while still assuring sufficient solder volume without encroachment possibly causing a short circuit between bond pads 12. FIG. 5 depicts an example where openings 22 are not centered within openings 52.

Figure 6:
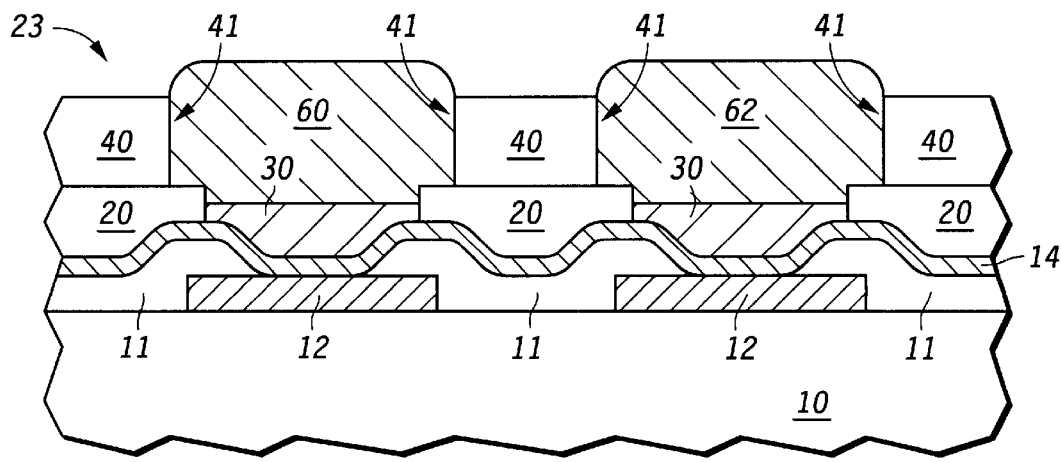

Referring to FIGS. 6 and 13, at step 138 solder bumps 60 and 62 are plated on copper studs 30. Solder bumps 60 and 62 may be any appropriate solder material. For example, plated solder bumps 60 and 62 may be any appropriate composition of tin or lead or any other appropriate plating material. Resist layer 40 prevents solder bumps 60 and 62 from encroaching upon each other while allowing sufficient solder volume. Openings 42 in resist layer 40 provide wells for solder bumps 60 and 62 to prevent such encroachment. However, in one embodiment, solder bumps 60 and/or 62 may still slightly mushroom over resist layer 40. That is, solder bumps 60 and/or 62 may still overlap edges 41 of FIG. 6.

Figure 7:
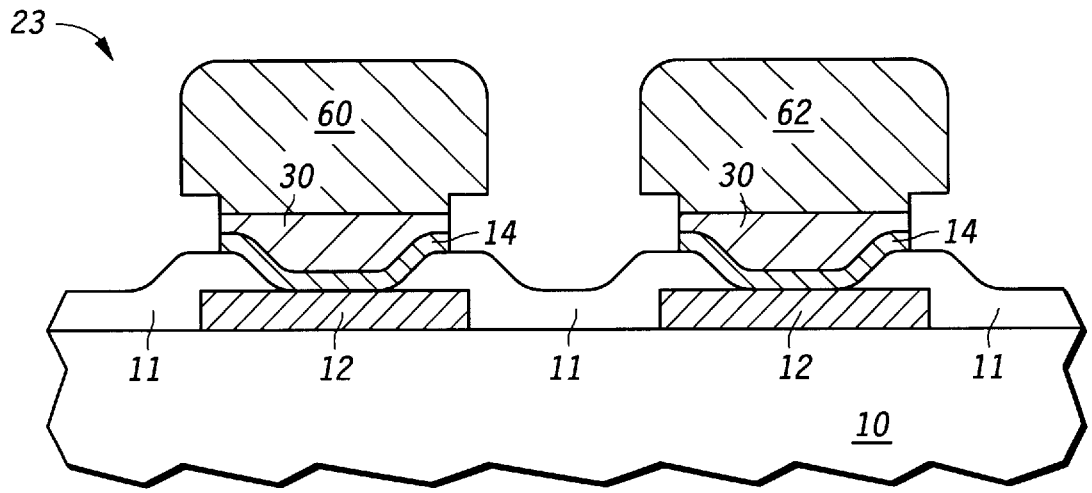

Referring to FIGS. 7 and 13, during step 139, the first and second resist layers 20 and 40 are removed. Exposed portions of barrier layer 14 are also removed leaving an under bump metallurgy layer portion of barrier layer 14 under copper studs 30.

Figure 8:
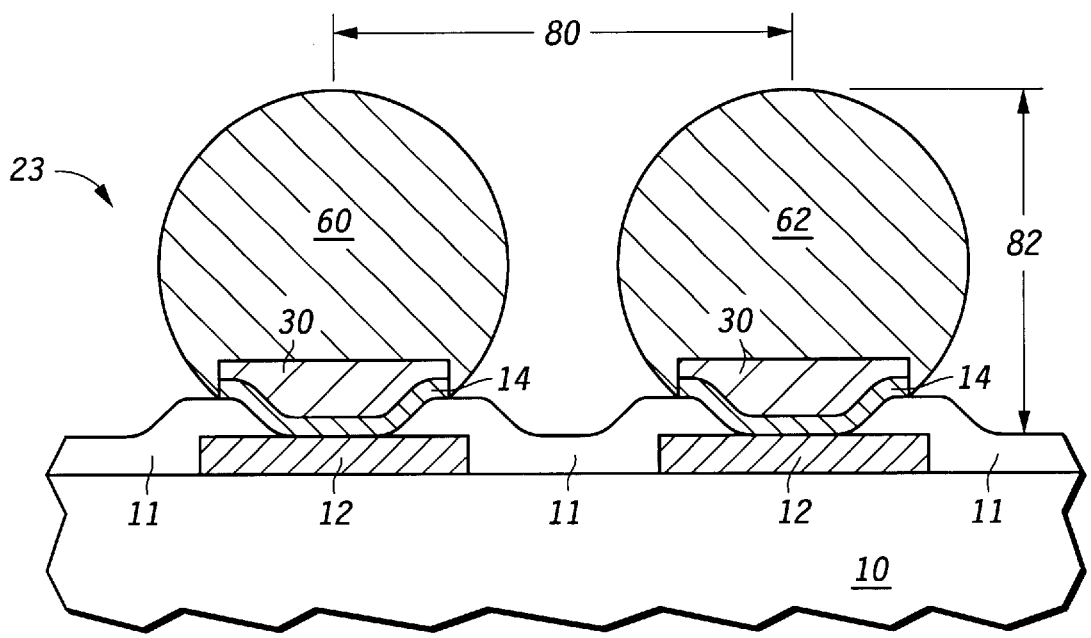

Referring to FIGS. 8 and 13, solder bumps 60 and 62 are heated in a reflow process to form substantially spherical reflowed solder bumps. In one embodiment solder bumps 60 and 62 have a center to center pitch 80 of approximately 150 microns. Solder volume and bump height 82 depends on the thickness of resist layer 40 and the size of openings 42. For example, if resist layer 40 is 50 microns, bump height 82 is approximately 98 microns high. In alternate embodiments, solder bumps 60 and 62 may not be reflowed until after being attached to a substrate.

Alternatively, both openings can be formed prior to forming the copper stud. In reference to FIG. 13, block 135 can be performed after block 137 and prior to block 138. For example, a first masking layer can be patterned to form a first opening to define the copper stud, followed by a second masking layer patterned to form a second opening. At this point, a copper stud is formed within at least a portion of the first opening, and a solder bump is then plated on the copper stud. Processing can then continue in a similar fashion as described above.

FIGS. 9–12 show various masking features (90, 100, 102, 110, 112, 120, and 122) and the corresponding resulting solder shapes (92, 104, 114, and 124). In one embodiment, the masking features may correspond to openings in a photoresist layer assuming positive photoresist is being used. However, alternate embodiments may require different masking features.

Figure 9:
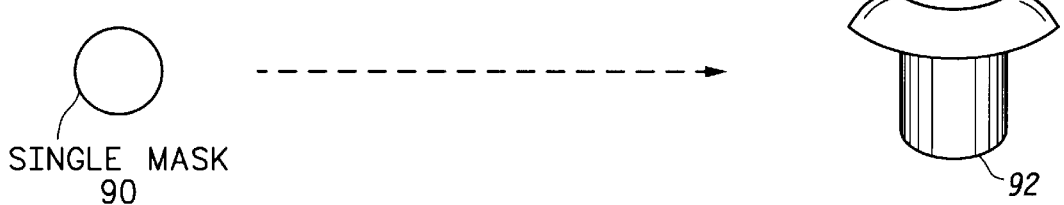
FIG. 9, labeled prior art, shows a conventional mask feature and the resulting solder bump structure.
Figure 10:
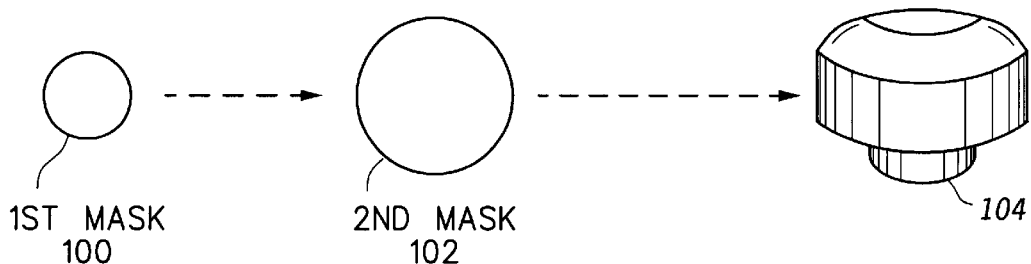
FIGS. 10–12 show the use of various paired mask features and corresponding resulting solder bump structures.
Figure 11:
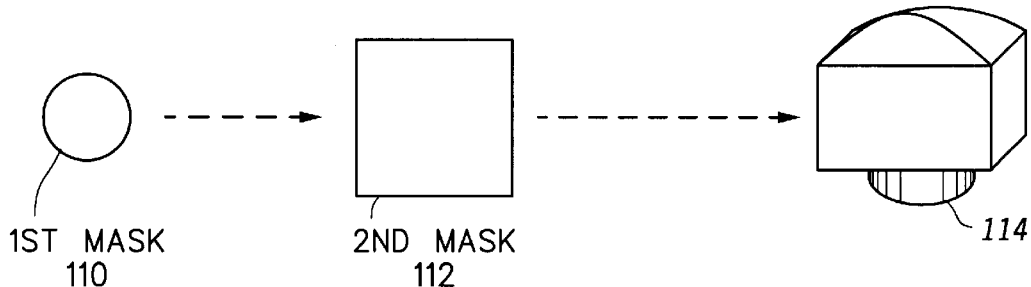
Figure 12:
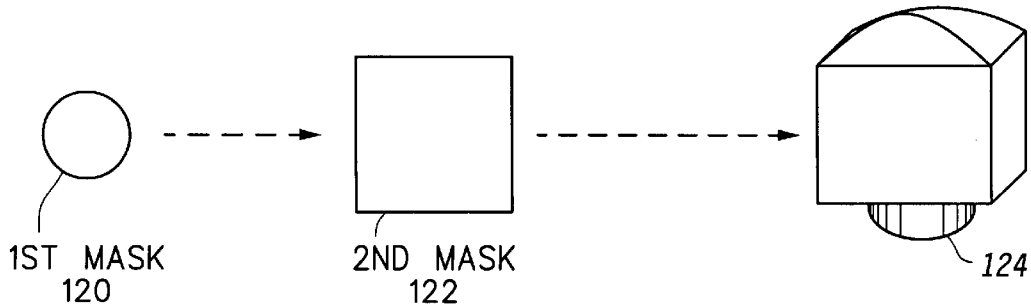

FIG. 9 labeled prior art shows a final plated solder shape 92 using a traditional single mask 90 process. For example, the single mask resist thickness of 50 microns would produce a solder volume of 0.378 cubic millimeters resulting in a solder bump height of 77 microns. FIG. 10 shows a novel dual mask process, using a first mask feature 100 and a second mask feature 102, resulting in the final plated solder shape 104. A first mask resist thickness of 15 microns with a second mask resist thickness of 35 microns results in, for example, a solder volume of 0.496 cubic millimeters. FIG. 11 shows a similar novel dual mask process, using a first mask feature 110 and a second mask feature 112, wherein the second mask is patterned to produce a square shaped well resulting in a final plated solder shape 114 whose top view is a square. Such an embodiment allows an increase in solder volume of up to approximately 0.604 cubic millimeters. FIG. 12 shows a further novel dual mask process, using a first mask feature 120 and a second mask feature 122, resulting in a final plated solder shape 124. In this embodiment, the second mask is increased in thickness from 35 microns to 50 microns to result in a taller final plated solder shape which also results in an increased solder volume of approximately 0.702 cubic millimeters or more. Such an embodiment results in a height of greater than or equal to approximately 98 microns.

Referring to FIG. 13, at step 141 the semiconductor device is singulated from wafer 23 and attached to a substrate using the solder bumps as the interconnect means using known methods. For example, the semiconductor device may be attached to a ceramic substrate or circuit board or other appropriate substrate. The bumps of the semiconductor device are reflowed while in contact with an array of pads on the substrate to provide electrical and mechanical interconnection. Various materials are then used to underfill the semiconductor device and encapsulate the resulting solder joints to reduce and distribute stress on the solder joints due to, for example, thermal expansion. The underfill provides matching thermal expansion characteristics to prevent interconnect fatigue and maintain the electrical and mechanical integrity of the solder interconnects. Based on the teachings herein, solder bumps 60 and 62 provide increased solder volume which provides increased standoff distance between the semiconductor device and the substrate, which results in improved underfill which increases reliability of the resulting flip chip assembly.

In the past, the ratio of solder bump pitch to the standoff distance has been greater than four to one with a solder bump pitch of greater than 200 microns. That is, in the past, the solder bump pitch was at least greater than four times the standoff distance. However, some embodiments of the present invention allow for a ratio of at most approximately four to one while maintaining a solder bump pitch of at most 200 microns. That is, for a flip chip assembly, or any other assembly described herein above, manufactured in accordance with an embodiment of the present invention, a pitch of only 200 microns may now correspond to a standoff of 50 microns. Therefore, a ratio of less than four to one can still allow for a reasonable standoff, which leads to improved reliability, even as pitches continue to decrease.

The above description is intended to describe at least one embodiment of the invention. The above description is not intended to define the scope of the invention. Rather, the scope of the invention is defined in the claims below. Thus, other embodiments of the invention include various modifications, additions, and/or improvements to the above description.

The foregoing components and devices are used herein as examples for sake of conceptual clarity. As for non-exclusive example, any type of appropriate surface mount technology may be used. Semiconductor device 23 is utilized as an exemplar of any general surface mount semiconductor device, including but not limited to flip chip assemblies. A flip chip or flip chip assembly includes any type of flip chip interconnect related package including for example, direct chip attach (DCA), various types of chip scale packages (CSP), chip-on-board (COB) or flip-chip-on-board (FCOB), Chip On Glass, and any like structures or assemblies. Consequently, as used herein these specific exemplars are intended to be representative of their more general classes. Furthermore, the use of any specific exemplar herein is also intended to be representative of its class and the non-inclusion of any specific devices in any exemplary lists herein should not be taken as indicating that limitation is desired.

Those skilled in the art will recognize that the operations described in exemplary embodiment are for illustration only. For example, some of the operations of FIG. 13 may be combined or the functionality of the operations may be distributed in additional operations or may even be performed in different orders.

Those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

While the above is a complete description of specific embodiments of the invention, various modifications, alternative constructions, and equivalents may be used. The above description is not intended to present an exhaustive list of embodiments of the invention. Although an attempt has been made to outline some exemplary embodiments and exemplary variations thereto, other embodiments and/or variations are within the scope of the invention as defined in the claims below.

What is claimed is:

1. A method for forming a bump structure, comprising:

providing a semiconductor device having a bond pad;

forming a first masking layer overlying the bond pad;

patterning the first masking layer to form a first opening overlying at least a portion of the bond pad;

forming a stud at least within the first opening;

forming a second masking layer overlying the first masking layer;

patterning the second masking layer to form a second opening overlying at least a portion of the first opening;

forming a first solder bump at least within the second opening; and removing the first masking layer and the second masking layer.

2. The method of claim 1, wherein the first masking layer has a thickness in a range of approximately 5 to 50 microns.

3. The method of claim 2, wherein the thickness of the first masking layer is in a range of approximately 10 to 20 microns.

4. The method of claim 1, wherein the first opening is a circular opening.

5. The method of claim 1, wherein the second masking layer has a thickness in a range of approximately 20 to 60 microns.

6. The method of claim 1, wherein the second opening is a rectangular opening.

7. The method of claim 1, wherein the first opening is centered within the second opening.

8. The method of claim 1, wherein forming the first solder bump within the second opening comprises electroplating solder on the stud.

9. The method of claim 1, further comprising removing the first masking layer and the second masking layer after forming the first solder bump.

10. The method of claim 9, further comprising reflowing the first solder bump to form a reflowed solder bump.

11. The method of claim 9, further comprising using the first solder bump to attach the semiconductor device to a substrate.

12. The method of claim 11, wherein the semiconductor device is spaced at least approximately 50 microns apart from the substrate.

13. The method of claim 1, further comprising forming a second solder bump spaced apart from the first solder bump, wherein the first and second solder bumps have a pitch of at most approximately 200 microns.

14. The method of claim 1, wherein the second opening is larger than the first opening.

15. The method of claim 1, wherein the second masking layer is thicker than the first masking layer.

16. The method of claim 1, further comprising forming a first layer overlying the semiconductor device and a portion of the bond pad.

17. The method of claim 16, wherein the first layer includes a barrier layer.

18. The method of claim 16, wherein the first layer includes an adhesion layer.

19. The method of claim 16, wherein forming the stud comprises electroplating copper on the first layer to form a plated copper stud, wherein the first layer includes a seed layer.

20. The method of claim 16, further comprising removing portions of the first layer overlying the semiconductor device.

21. The method of claim 20, further comprising reflowing the first solder bump to form a reflowed solder bump.

22. The method of claim 16, wherein the semiconductor device further comprises a passivation layer overlying the first layer and having an opening that exposes a portion of the first layer overlying the bond pad.

23. The method of claim 1, wherein forming the stud is performed after patterning the second masking layer.

* * * * *